(12) United States Patent
Yeh

(10) Patent No.: US 8,037,236 B2
(45) Date of Patent: Oct. 11, 2011

(54) FLASH MEMORY WRITING METHOD AND STORAGE SYSTEM AND CONTROLLER USING THE SAME

(75) Inventor: Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 364 days.

(21) Appl. No.: 12/465,882

(22) Filed: May 14, 2009

(65) Prior Publication Data
US 2010/0241788 A1    Sep. 23, 2010

(30) Foreign Application Priority Data

Mar. 20, 2009   (TW) .............................. 98109190 A

(51) Int. Cl.
G06F 12/00 (2006.01)
G06F 3/00 (2006.01)
G06F 13/00 (2006.01)
G06F 12/02 (2006.01)

(52) U.S. Cl. ................ 711/103; 711/206; 711/E12.001; 711/E12.008; 711/E12.103; 710/52; 365/185.01; 365/185.09; 365/185.11

(58) Field of Classification Search .................. None
See application file for complete search history.

(56) References Cited

U.S. PATENT DOCUMENTS 5,835,935 A * 11/1998 Estakhri et al. ................ 711/103

* cited by examiner

Primary Examiner — Hoai V Ho
Assistant Examiner — James G Norman
(74) Attorney, Agent, or Firm — J.C. Patents

(57) ABSTRACT

A flash memory writing method for writing data into a flash memory storage system is provided. In the present method, a big data usage number and a small data usage number are counted for each logical unit in the flash memory storage system, so as to respectively represent the numbers of writing a big data and a small data into each the logical unit. When a host system writes new data into a logical unit in the flash memory storage system, the new data is written through different writing processes according to the big data usage number and the small data usage number of the logical unit. Thereby, the data writing efficiency is improved and the lifespan of the flash memory storage system is prolonged.

24 Claims, 12 Drawing Sheets

FLASH MEMORY WRITING METHOD AND STORAGE SYSTEM AND CONTROLLER USING THE SAME

CROSS-REFERENCE TO RELATED APPLICATION

This application claims the priority benefit of Taiwan application serial no. 98109190 filed Mar. 20, 2009. The entirety of the above-mentioned patent application is hereby incorporated by reference herein and made a part of specification.

BACKGROUND

1. Technology Field

The present invention generally relates to a flash memory writing method, and more particularly, to a flash memory writing method which can write data through different writing processes according to a usage pattern of each logical block in a flash memory and a flash memory storage system and a flash memory controller using the same.

2. Description of Related Art

Along with the widespread of digital cameras, cell phones, and MP3 in recently years, the consumers' demand to storage media for storing digital contents has increased drastically. Flash memory is one of the most adaptable storage media to be carried around and used for storing digital files due to its characteristics such as data non-volatility, low power consumption, small volume, and non-mechanical structure.

Conventionally, a flash memory storage device is mainly used for storing user data. For example, a user may use a flash drive for storing digital files or use a memory card as the storage medium of a portable device, such as a digital camera or a MP3 player. Such a flash memory storage device is usually used for storing digital data of large quantity (for example, data above 64 Kb or 128 Kb). Along with the development of flash memory technology, the storage capacity of flash memory storage devices has increased while the cost thereof has decreased. Thus, many computer manufacturers start to use solid state drive (SSD, which has a flash memory as its storage medium) as the primary disk in computer systems.

Based on the physical characteristics of flash memory, the memory cells in a flash memory can only be programmed in a single direction (i.e., each bit in a memory cell can only be programmed from "1" to "0"). Thus, before writing a new data into a memory cell of a flash memory, the data previously stored in the memory cell has to be erased first.

Regarding the design of a flash memory storage system, physical blocks in the flash memory storage system are usually grouped into a plurality of physical units. Each physical unit has at least one flash memory cell, wherein the flash memory cell is composed of at least one transistor (such as a metal oxide semiconductor field effect transistor (MOSFET) or other logic circuit) and stores at least one bit. These physical units are grouped into a data area and a spare area. Physical units in the data area store valid data written by write commands, and physical units in the spare area are used for substituting the physical units in the data area when the write commands are executed. To be specific, when a flash memory storage system receives a write command from a host and is desired to write new data into a physical unit to be updated in the data area, the flash memory storage system selects a physical unit from the spare area and writes both the valid old data copied from the physical unit to be updated in the data area and the new data into the physical unit selected from the spare area. Then, the flash memory storage system links the physical unit containing the new data to the data area and erases the physical unit ro be updated and links it to the spare area. In order to allow the host to successfully access the physical units which are alternatively used for storing data, the flash memory storage system provides logical units to the host. Namely, the flash memory storage system reflects the alternation of the physical units by recording and updating mapping relationships between the logical units and the physical units in the data area in a logical address-physical address mapping table. Thereby, the host simply writes data into a provided logical unit while the flash memory storage system accesses the corresponding physical unit according to the logical address-physical address mapping table.

Based on the operation mechanism of flash memory storage system described above, when a flash memory storage system is used as a primary hard disk of a computer system, because the computer system frequently writes and updates data in small quantities (for example, data less than 4 Kb or 8 Kb), erasing operations will be frequently performed to the physical units in the flash memory storage system in order to write data alternatively into the physical units. However, the physical blocks for forming a physical unit can only be erased for a limited number of times (for example, 10,000 times at most). Thus, the lifespan of a flash memory storage device will be greatly shortened by frequently erasing the physical units thereof.

SUMMARY

Accordingly, the present invention is directed to a data writing method which can improve the data writing efficiency and prolong the lifespan of a flash memory storage system.

The present invention is also directed to a flash memory controller which can improve the data writing efficiency and prolong the lifespan of a flash memory storage system.

The present invention is further directed to a flash memory storage system with improved data writing efficiency and prolonged lifespan.

An exemplary embodiment of the present invention provides a flash memory writing method implemented in a flash memory storage system. The flash memory storage system includes a plurality of logical units and a plurality of physical units, wherein each of the logical units is mapped to at least one of the physical units, and each of the physical units has at least one flash memory cell. The flash memory writing method includes counting a big data usage number and a small data usage number of each of the logical units, wherein the big data usage number represents the number of writing a big data into the logical unit, the small data usage number represents the number of writing a small data into the logical unit, a data length of the big data is more than a data quantity threshold, and a data length of the small data is not more than the data quantity threshold. When a host system writes new data into a corresponding logical unit among the logical units, the flash memory writing method further includes writing the new data into the flash memory storage system according to data writing steps corresponding to the big data usage number or the small data usage number of the corresponding logical unit.

An exemplary embodiment of the present invention also provides a flash memory controller for controlling a flash memory storage system. The flash memory storage system includes a plurality of logical units and a plurality of physical units, wherein each of the logical units is mapped to at least one of the physical units. The flash memory controller includes a microprocessor unit, a host interface unit for electrically connecting a host system, a flash memory interface unit for electrically connecting the physical units, and a memory management unit. The memory management unit counts a big data usage number and a small data usage number for each of the logical units, and when the host system writes new data into a corresponding logical unit among the logical units, the memory management unit writes the new data into the flash memory storage system according to data writing steps corresponding to the big data usage number or the small data usage number of the corresponding logical unit, wherein the big data usage number represents the number of writing a big data into the logical unit, the small data usage number represents the number of writing a small data into the logical unit, a data length of the big data is more than a data quantity threshold, and a data length of the small data is not more than the data quantity threshold.

An exemplary embodiment of the present invention further provides a flash memory storage system including a plurality of logical units to be accessed by a host system, a plurality of physical units, and a flash memory controller, wherein each of the logical units is mapped to at least one of the physical units. The flash memory controller counts a big data usage number and a small data usage number for each of the logical units, and when the host system writes new data into a corresponding logical unit among the logical units, the flash memory controller writes the new data into the flash memory storage system according to data writing steps corresponding to the big data usage number or the small data usage number of the corresponding logical unit, wherein the big data usage number represents the number of writing a big data into the logical unit, the small data usage number represents the number of writing a small data into the logical unit, a data length of the big data is more than a data quantity threshold, and a data length of the small data is not more than the data quantity threshold.

As described above, in the present invention, a big data usage number and a small data usage number are counted for each logical unit, so as to obtain a usage pattern of the logical unit, and data is written into the flash memory storage system through different writing process according to this usage pattern. Thereby, the data writing efficiency is improved and the lifespan of the flash memory storage system is prolonged.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
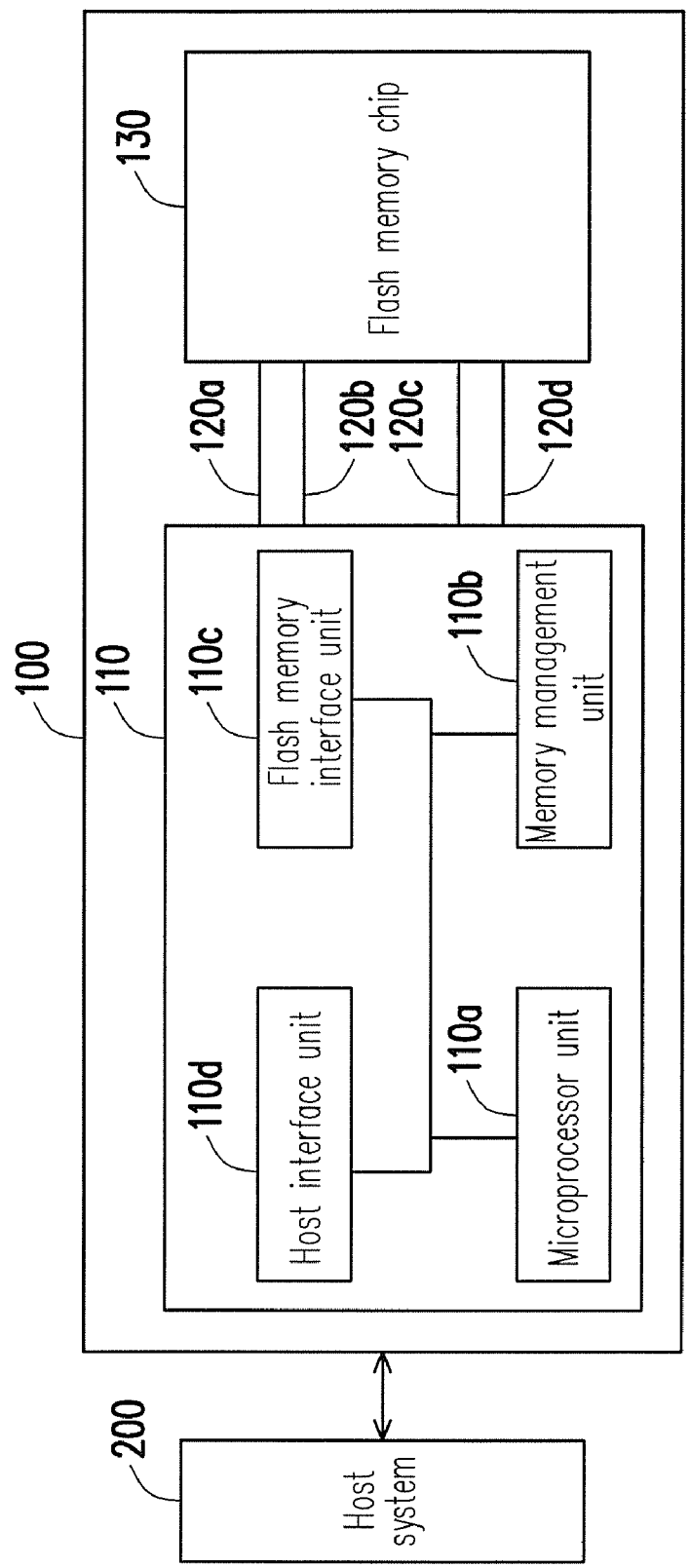
FIG. 1 is a schematic block diagram of a flash memory storage system according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic block diagram of a flash memory storage system according to an exemplary embodiment of the present invention.

Referring to FIG. 1, the flash memory storage system 100 usually works along with a host system 200 so that the host system 200 can write data into or read data from the flash memory storage system 100. In the present embodiment, the flash memory storage system 100 is a solid state drive (SSD). However, the flash memory storage system 100 may also be a memory card or a flash drive in another embodiment of the present invention.

The flash memory storage system 100 includes a flash memory controller 110 and a flash memory chip 130.

The flash memory controller 110 executes a plurality of logic gates or control instructions implemented as hardware or firmware and accesses data in the flash memory chip 130 according to instructions of the host system 200. The flash memory controller 110 includes a microprocessor unit 110a, a memory management unit 110b, a flash memory interface unit 110c, and a host interface unit 110d.

The microprocessor unit 110a cooperates with the memory management unit 110b, the flash memory interface unit 110c, and the host interface unit 110d to carry out various operations of the flash memory storage system 100.

The memory management unit 110b coupled to the microprocessor unit 110a executes a block management mechanism and a data writing mechanism according to the present exemplary embodiment.

In the present embodiment, the memory management unit 110b is implemented in the flash memory controller 110 as a firmware. For example, the memory management unit 110b including a plurality of machine instructions is burnt into a program memory (for example, a read only memory, ROM), and the program memory is embedded into the flash memory controller 110. When the flash memory storage device 100 is in operation, the machine instructions of the memory management unit 110b are executed by the microprocessor unit 110a so that the block management mechanism and the data writing mechanism in the present embodiment can be performed.

In another embodiment of the present invention, the machine instructions of the memory management unit 110b may also be stored as a software in a specific area (for example, a system area in a flash memory exclusively for storing system data) of the flash memory chip 130. Similarly, when the flash memory storage device 100 is in operation, the machine instructions of the memory management unit 110b are executed by the microprocessor unit 110a. In yet another embodiment of the present invention, the memory management unit 110b may also be implemented as hardware in the flash memory controller 110.

The flash memory interface unit 110c is coupled to the microprocessor unit 110a for accessing the flash memory chip 130. Namely, data to be written into the flash memory chip 130 is converted by the flash memory interface unit 110c into a format acceptable to the flash memory chip 130.

The host interface unit 110d is coupled to the microprocessor unit 110a for receiving and identifying instructions of the host system 200. Namely, an instruction and data from the host system 200 are transmitted to the microprocessor unit 110a through the host interface unit 110d. In the present exemplary embodiment, the host interface unit 110d is a SATA interface. However, the present invention is not limited thereto, and the host interface unit 110d may also be a USB interface, an IEEE 1394 interface, a PCI Express interface, a MS interface, a MMC interface, a SD interface, a CF interface, an IDE interface, or other suitable data transmission interfaces.

In addition, even though not shown in the present embodiment, the flash memory controller 110 may further include other general function modules for controlling the flash memory, such as a buffer memory, an error correcting unit, and a power management unit.

The flash memory chip 130 is electrically connected to the flash memory controller 110 for storing data. In the present embodiment, the flash memory chip 130 is a multi level cell (MLC) NAND flash memory. However, the present invention is not limited thereto, and the flash memory chip 130 may also be a single level cell (SLC) NAND flash memory in another embodiment of the present invention.

Figure 2:
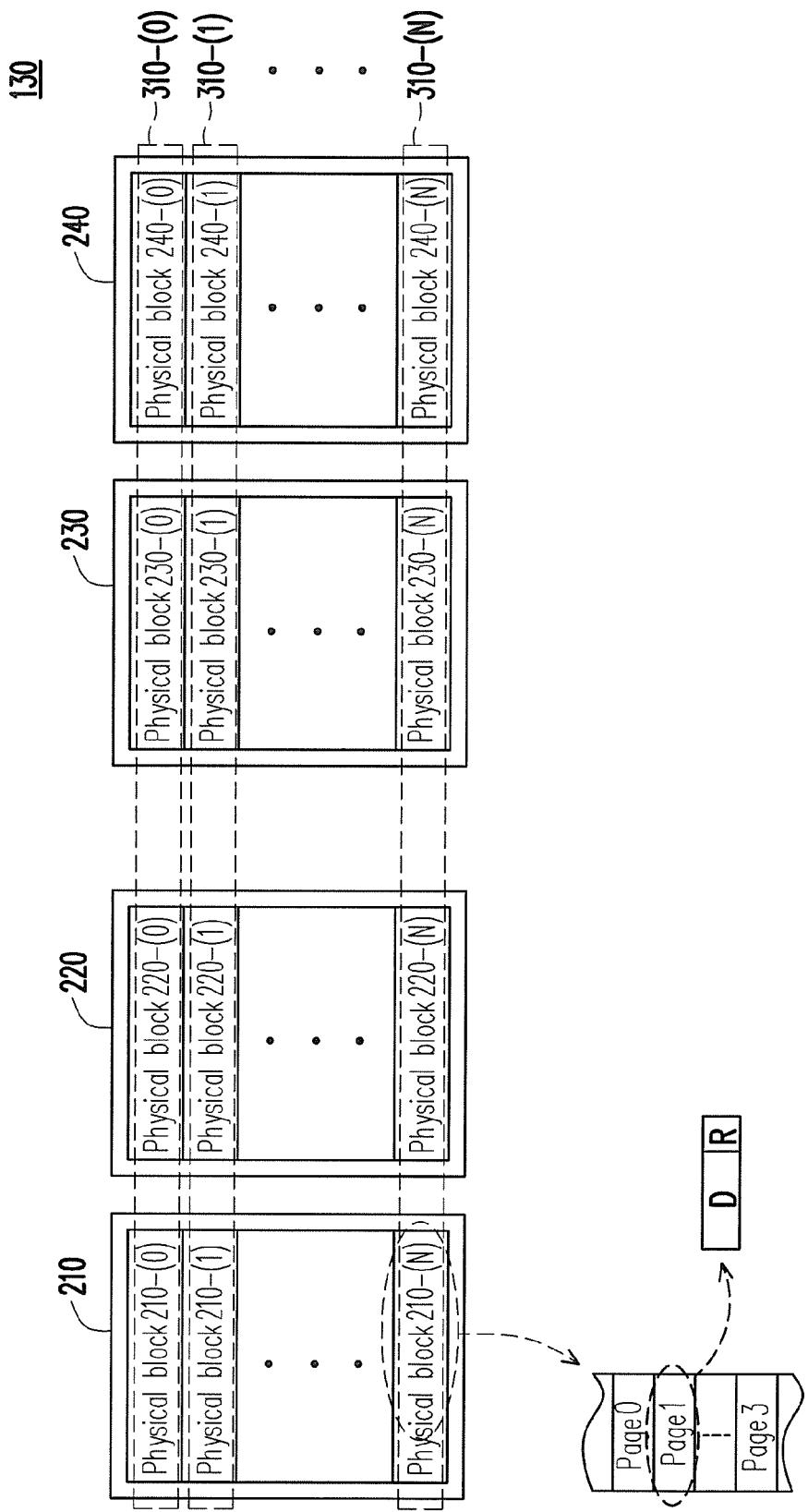
FIG. 2 is a schematic block diagram of a flash memory chip according to an exemplary embodiment of the present invention.

FIG. 2 is a schematic block diagram of a flash memory chip according to an exemplary embodiment of the present invention.

In the present exemplary embodiment, the flash memory chip 130 includes a first flash memory module 210, a second flash memory module 220, a third flash memory module 230, and a fourth flash memory module 240, wherein the first flash memory module 210 has physical blocks 210-(0)~210-(N), the second flash memory module 220 has physical blocks 220-(0)~220-(N), the third flash memory module 230 has physical blocks 230-(0)~230-(N), and the fourth flash memory module 240 has physical blocks 240-(0)~240-(N). It should be mentioned that even though the flash memory chip 130 in the present exemplary embodiment has four flash memory modules, the number of flash memory modules in the flash memory chip 130 is not limited in the present invention.

In the flash memory chip 130, data is erased in unit of physical blocks. Namely, each physical block contains the smallest number of memory cells which are erased together. Each physical block is usually divided into a plurality of pages. Because in the present exemplary embodiment, the flash memory chip 130 is a MLC NAND flash memory, each page is the smallest programming unit. In other words, page is the smallest unit for reading and writing data. Each page is usually divided into a user data area D and a redundant area R, wherein the user data area D is used for storing user data, and the redundant area R is used for storing system data (for example, an error checking and correcting code, ECC code). In the present exemplary embodiment, each page in the flash memory chip 130 has 8 sectors. Generally speaking, each sector has 512 bytes. Accordingly, each page in the flash memory chip 130 has 4 kilo bytes (KB).

It should be noted that in other flash memory designs (for example, a SLC NAND flash memory), the smallest programming unit may also be sector, namely, data is programmed in unit of sectors.

Generally speaking, a physical block may be composed of any number of pages, such as 64 pages, 128 pages, and 256 pages, etc. Besides, the physical blocks in the first flash memory module 210, the second flash memory module 220, the third flash memory module 230, and the fourth flash memory module 240 are usually grouped into several zones. By managing the physical blocks 210-(0)~210-(N), the physical blocks 220-(0)~220-(N), the physical blocks 230-(0)~230-(N), and the physical blocks 240-(0)~240-(N) in unit of zones, the parallelism of operations is increased and the management of these physical blocks is simplified.

In addition, the flash memory controller 110 logically groups the physical blocks in the first flash memory module 210, the second flash memory module 220, the third flash memory module 230, and the fourth flash memory module 240 into a plurality of physical units, wherein a physical unit may contain 4 physical blocks. By managing the flash memory chip 130 in unit of physical units, the flash memory controller 110 maintains the logical address-physical address mapping table in a greater unit (i.e., the physical units). As a result, the required space in the buffer memory 110d is reduced. In the present exemplary embodiment, the physical blocks 210-(0)~210-(N), the physical blocks 220-(0)~220-(N), the physical blocks 230-(0)~230-(N), and the physical blocks 240-(0)~240-(N) are logically grouped into physical units 310-(0)~310-(N).

It should be mentioned that in the present exemplary embodiment, because the flash memory chip 130 has the first flash memory module 210, the second flash memory module 220, the third flash memory module 230, and the fourth flash memory module 240, a plurality of I/O buses (i.e., I/O buses 120a, 120b, 120c, and 120d) is further disposed between the flash memory controller 110 and the flash memory chip 130, wherein the I/O buses 120a, 120b, 120c, and 120d are respectively used for communication between the flash memory controller 110a and the first flash memory module 210, the second flash memory module 220, the third flash memory module 230, and the fourth flash memory module 240. Particularly, in the present exemplary embodiment, since the flash memory storage system 100 has 4 I/O buses, the flash memory controller 110 can selectively execute a single channel access or a multi channel access in different situations to access the flash memory chip 130. For example, when the flash memory controller 110a executes the multi channel access to simultaneously access the first flash memory module 210, the second flash memory module 220, the third flash memory module 230, and the fourth flash memory module 240, the access speed can be increased. Even though 4 I/O buses are disposed in the flash memory storage system 100 in the present exemplary embodiment, the present invention is not limited thereto, and the number of I/O buses can be determined according to the number of flash memory modules or according to the actual design requirement.

Figure 3A:
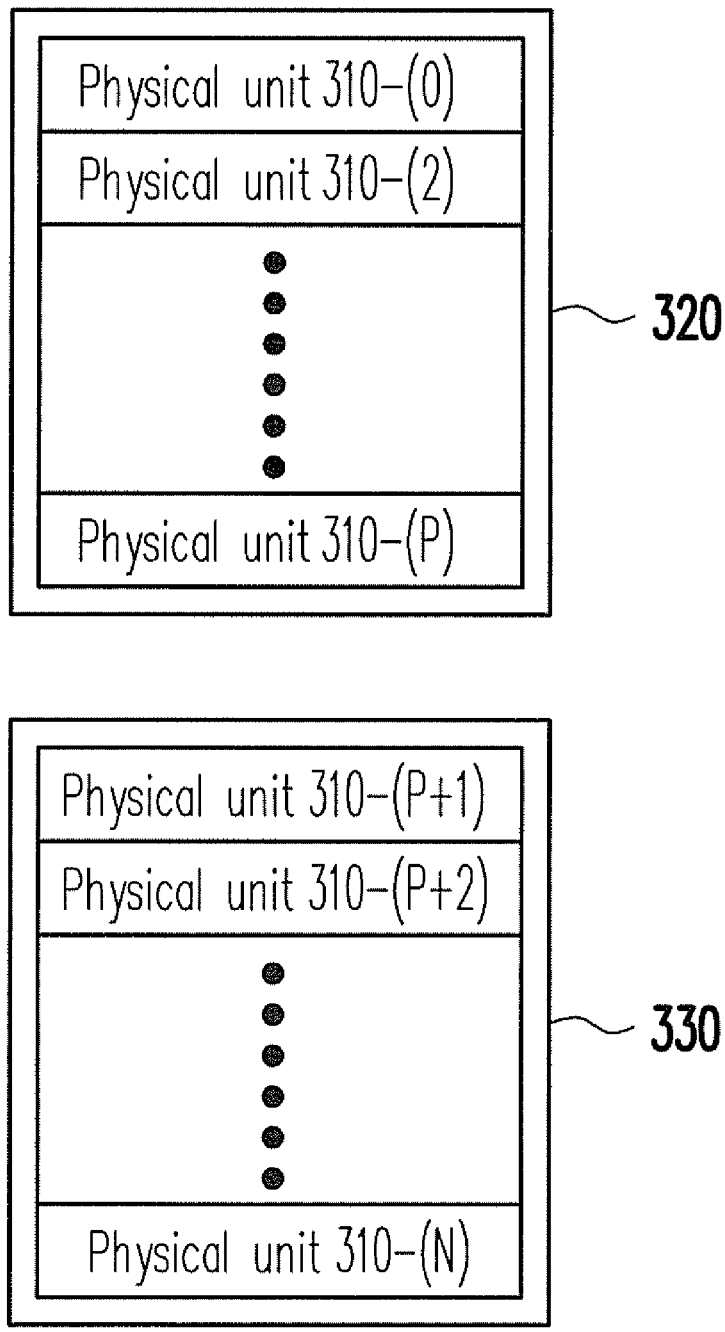
FIGS. 3A~3C are diagrams illustrating the operations of a flash memory chip according to an exemplary embodiment of the present invention.
Figure 3B:
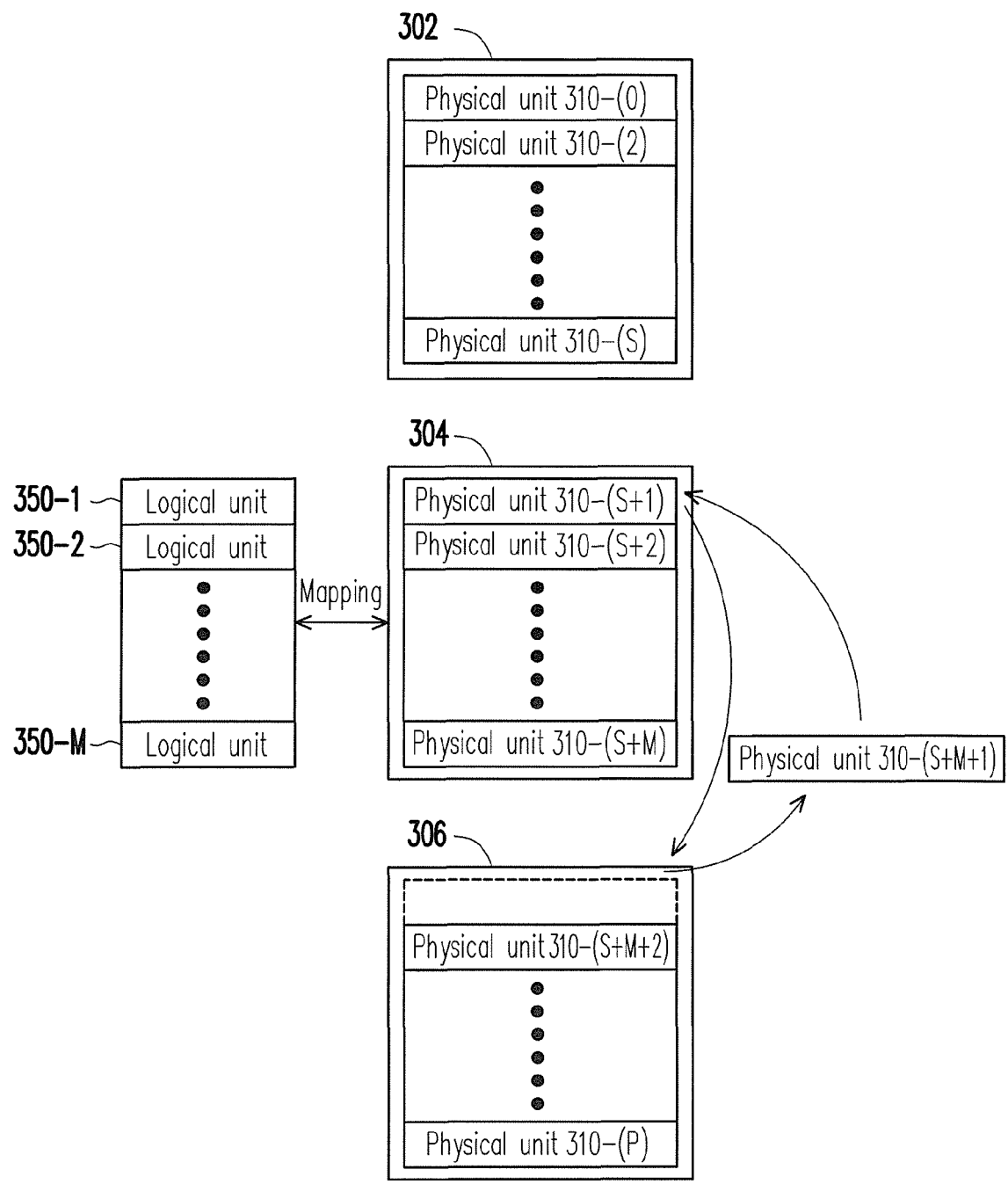
Figure 3C:
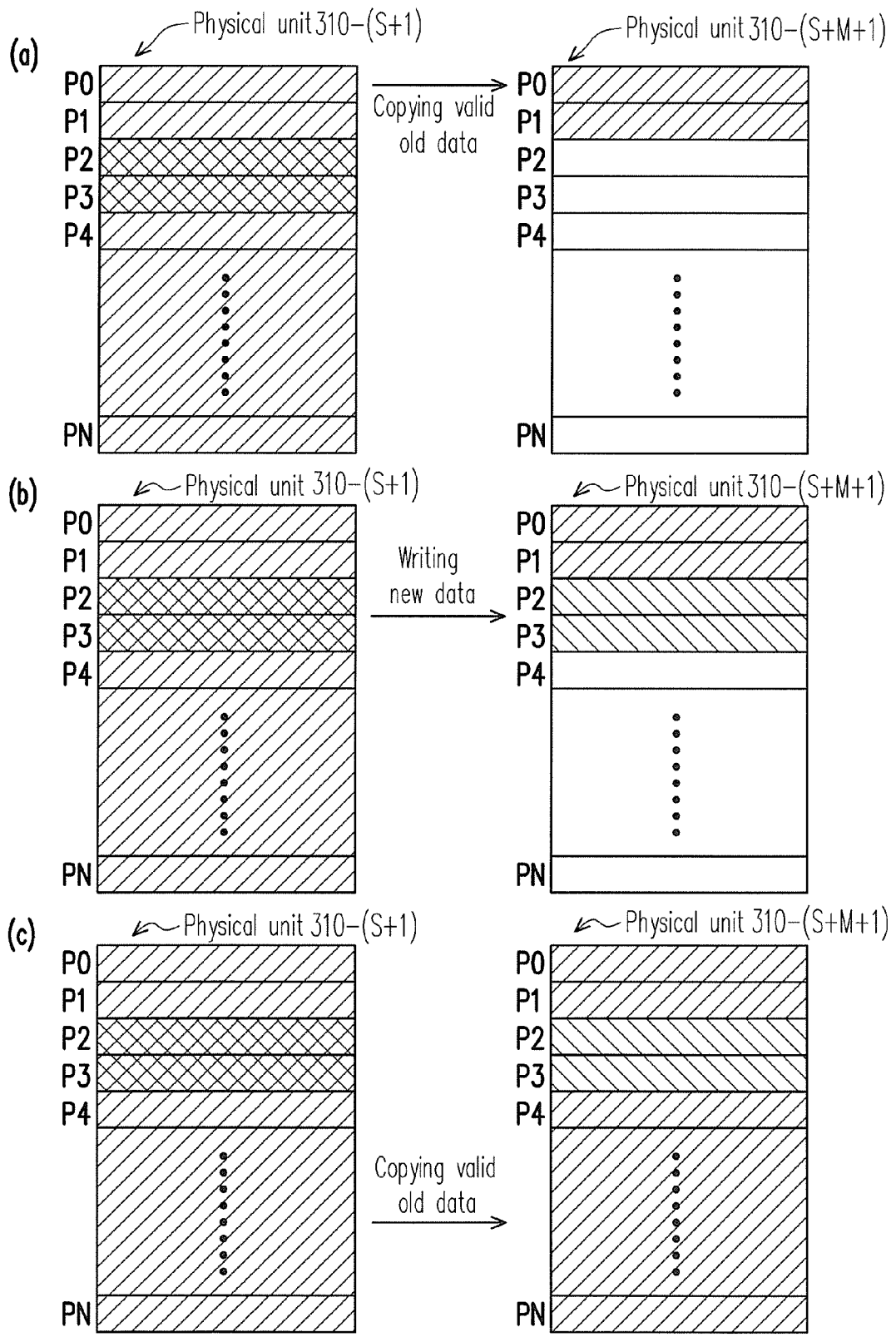

FIGS. 3A-3C are diagrams illustrating the operations of a flash memory chip according to an exemplary embodiment of the present invention.

It should be understood that in following description, the terms "select", "move", "replace", "substitute", "alternate", and "group" only refer to logical operations performed to the physical blocks in the flash memory chip 130. Namely, the actual positions of the physical blocks in the flash memory chip 130 are not changed, and the physical blocks in the flash memory are only operated logically. It should be mentioned that following operations are carried out by the memory management unit 110b of the flash memory controller 110.

Referring to FIG. 3A, the memory management unit 110b logically groups the physical blocks in the flash memory chip 130 into the physical units 310-(0)~310-(N) and further logically groups the physical units 310-(0)~310-(N) into a storage area 320 and a replacement area 330.

The physical units 310-(0)~310-(P) in the storage area 320 are the physical units which are normally used in the flash memory storage system 100. Namely, the memory management unit 110b writes data into the physical units in the storage area 320.

The physical units 310-(P+1)~310-(N) in the replacement area 330 are substitute physical units. For example, when the flash memory chip 130 is manufactured, 4% of the physical blocks therein are reserved for substitution purpose. Namely, when a physical block in the storage area 210 is damaged, a physical block in the replacement area 220 is selected for replacing the damaged physical block (i.e., bad block). Thus, if there are still available physical blocks in the replacement area 220 and a physical block is damaged, the memory management unit 110b selects an available physical block from the replacement area 220 for replacing the damaged physical block. If there is no available physical block in the replacement area 220 and a physical block is damaged, the flash memory storage device 100 is announced to be invalid.

Referring to FIG. 3B, the memory management unit 110b logically groups the physical blocks in the storage area 320 into a system area 302, a data area 304, and a spare area 306.

The system area 302 contains physical units 310-(0)~310-(S), the data area 304 contains physical units 310-(S+1)~310-(S+M), and the spare area 306 contains physical units 310-(S+M+1)~310-(P). In the present embodiment, foregoing S, M, and P are positive integers, and which respectively represent the number of physical blocks disposed in each area and can be determined by the manufacturer of the flash memory storage system according to the capacities of the flash memory modules.

Physical units in the system area 302 are used for recording system data, wherein the system data includes the manufacturer and model of the flash memory chip, the number of zones in each flash memory module, the number of physical blocks in each zone, and the number of pages in each physical block, etc.

Physical units in the data area 304 are used for storing user data. Generally speaking, these physical units are mapped to the logical units accessed by the host system 200. Namely, the physical units in the data area 304 are used for storing valid data.

Physical units in the spare area 306 are used for substituting the physical units in the data area 304. Thus, the physical units in the spare area 306 are blank or available units, namely, no data is recorded in these physical units or data recorded therein is marked as invalid data. In other words, physical units in the data area 304 and the spare area 306 are used alternatively for storing data to be written by the host system 200 into the flash memory storage device 100.

As described above, physical units in the flash memory chip 130 are alternatively provided to the host system 200 for storing data. Thus, the memory management unit 110b provides the logical units 350-1~350-M to the host system 200 to be used for data access and records the physical units mapped to the logical units in a logical address-physical address mapping table.

Referring to both FIG. 3B and FIG. 3C, for example, when the host system 200 is about to write a data into the logical unit 350-1, the memory management unit 110b obtains that the logical unit 350-1 is currently mapped to the physical unit 310-(S+1) in the data area 304 according to the logical address-physical address mapping table. Thus, the memory management unit 110b updates the data in the physical unit 310-(S+1), and meanwhile, the flash memory controller 110 selects the physical unit 310-(S+M+1) from the spare area 306 for substituting the physical unit 310-(S+1) in the data area 304. However, when the memory management unit 110b writes the new data into the physical unit 310-(S+M+1), the memory management unit 110b does not instantly move all the valid data in the physical unit 310-(S+1) to the physical unit 310-(S+M+1) to erase the physical unit 310-(S+1). To be specific, the memory management unit 110b copies the valid data in the physical unit 310-(S+1) before the page to be written (i.e., the pages P0 and P1) into the physical unit 310-(S+M+1) (as shown in FIG. 3C(a)), and writes the new data (i.e., the pages P2 and P3 in the physical unit 310-(S+M+1)) into the physical unit 310-(S+M+1) (as shown in FIG. 3C(b)). Herein, the memory management unit 110b completes the data writing operation. Because the valid data in the physical unit 310-(S+1) may become invalid during a next operation (for example, a write command), it may be meaningless to move all the valid data in the physical unit 310-(S+1) instantly to the substitute physical unit 310-(S+M+1). In this example, the combined contents of the physical units 310-(S+1) and 310-(S+M+1) is the complete content of the corresponding logical unit 350-1. The number of such transient mother-child relationships (i.e., the physical units 310-(S+1) and 310-(S+M+1)) is determined according to the capacity of a buffer memory 110d in the flash memory controller 110, and the operation for temporarily maintaining such a transient relationship is referred to as "opening" mother-child units.

It should be noted that such transient mother-child relationship can be instantly recorded in the logical address-physical address mapping table, or the logical units which are currently in such transient mother-child relationship and the corresponding physical units can be instantly recorded in a transient mother-child relationship table, or whether a logic unit is in such a transient mother-child relationship can be indicated with a specific code in the logical address-physical address mapping table. Thus, in the present disclosure, the physical unit mapped to a logical unit is not limited to the physical unit recorded in the logical address-physical address mapping table, and which may also include physical units corresponding to the information recorded in the logical address-physical address mapping table (wherein the information is not limited to that established because of the transient mother-child relationship) or physical units corresponding to the transient mother-child relationship table or a data buffer recording table, wherein the data buffer recording table records the logical address-physical address mapping relationship in a flash memory buffer area exclusively for storing data of small quantities, and the logical address-physical address mapping relationship is recorded in the data buffer recording table in unit smaller than a physical unit, such as a page or a block.

Thereafter, only when the contents in the physical units 310-(S+1) and 310-(S+M+1) are to be really combined, the memory management unit 110b integrates the physical unit 310-(S+1) and the physical unit 310-(S+M+1) into a single physical unit, so that the efficiency in using these units can be improved. Such an integration action is also referred to as "closing" the mother-child units. For example, as shown in FIG. 3C(c), when the mother-child units are closed, the memory management unit 110b copies the remaining valid data in the physical unit 310-(S+1) (i.e., pages P4~PN) to the substitute physical unit 310-(S+M+1), and then erases the physical unit 310-(S+1) and links it to the spare area 306. Meanwhile, the memory management unit 110b links the physical unit 310-(S+M+1) to the data area 304 and updates the logical address-physical address mapping table to indicate that the logical unit 350-1 is now mapped to the physical unit 310-(S+M+1).

As described above, in the present exemplary embodiment, the memory management unit 110b performs the operations for opening and closing mother-child units to all the physical blocks in each physical unit. Thus, the memory management unit 110b simultaneously accesses the physical blocks belonging to the same physical unit in the first flash memory module 210, the second flash memory module 220, the third flash memory module 230, and the fourth flash memory module 240 through the I/O buses 120a, 120b, 120c, and 120d in a multi channel access mode, so that the data access efficiency can be improved. For example, in another exemplary embodiment of the present invention, when the host system 200 writes a data of 32 sectors into the logical unit 350-1, the memory management unit 10b respectively writes a data of 8 sectors (i.e., one page) into the 4 physical blocks belonging to the same physical unit mapped to the logical unit 350-1 through the I/O buses 120a, 120b, 120c, and 120d in the multi channel access mode.

Additionally, in the present exemplary embodiment, when the host system 200 only updates a small quantity of data in a physical unit, the memory management unit 110b only accesses one physical block in the physical unit in the single channel access mode. For example, when the host system 200 issues a write command to write a data of 8 sectors into the logical unit 350-1, the memory management unit 110b only performs foregoing operations for opening and closing mother-child units to one of the physical blocks in the physical unit mapped to the logical unit 350-1 in the single channel access mode, so that the other physical blocks in the physical unit need not to be erased. Meanwhile, because the physical blocks are erased less number of times when data is written in the single channel access mode, the lifespan of the flash memory storage system 100 is prolonged.

In the present exemplary embodiment, the memory management unit 110b builds a big data usage number and a small data usage number for each of the logical units 350-1~350-M, wherein the big data usage number represents the number of writing a big data into the logical unit, and the small data usage number represents the number of writing a small data into the logical unit. Herein, the big data and the small data are distinguished according to their data lengths. For example, a data is considered as a big data when the data length of the data is more than a data quantity threshold, and a data is considered as a small data when the data length of the data is not more than the data quantity threshold, wherein the data quantity threshold can be determined by a user. In the present exemplary embodiment, the data quantity threshold is 8 KB.

Namely, in the present exemplary embodiment, the pattern of how data is previously stored in each of the logical units 350-1~350-M is recorded. Accordingly, the memory management unit 110b can obtain the pattern of how the host system 200 uses each of the logical units 350-1~350-M by comparing the big data usage number and the small data usage number of the logical unit. For example, when the host system 200 writes data into the logical unit 350-1, the memory management unit 110b can get to know whether the logical unit 350-1 is usually used for storing big data or small data by comparing the big data usage number and the small data usage number of the logical unit 350-1. If the big data usage number of the logical unit 350-1 is more than the small data usage number thereof, the memory management unit 110b determines that the logical unit 350-1 is always used for storing big data and writes the data received from the host system 200 into the corresponding physical unit in the multi channel access mode. If the big data usage number of the logical unit 350-1 is not more than the small data usage number thereof, the memory management unit 110b determines that the logical unit 350-1 is always used for storing small data and writes the data received from the host system 200 into the corresponding physical unit in the single channel access mode.

It should be mentioned that in another exemplary embodiment of the present invention, if the access modes include a single channel access mode, a double channel access mode, and a four channel access mode, etc, foregoing method for distinguishing the usage pattern of the logical units can correspondingly categorize a data as small data, medium data, and big data, etc and write the data in different channel access mode according to the categorization of the data. For example, a small data is written in the single channel access mode, a medium data is written in the double channel access mode, and a big data is written in the four channel access mode, etc.

In an exemplary embodiment of the present invention, the information regarding the big data usage numbers and the small data usage numbers of the logical units 350-1~350-M is stored in a buffer memory (not shown) of the flash memory storage system, and when the flash memory storage system is powered on, the information is stored into the flash memory chip, and when the flash memory storage system is turned on again, the stored information is loaded into the flash memory controller to be updated.

Figure 4:
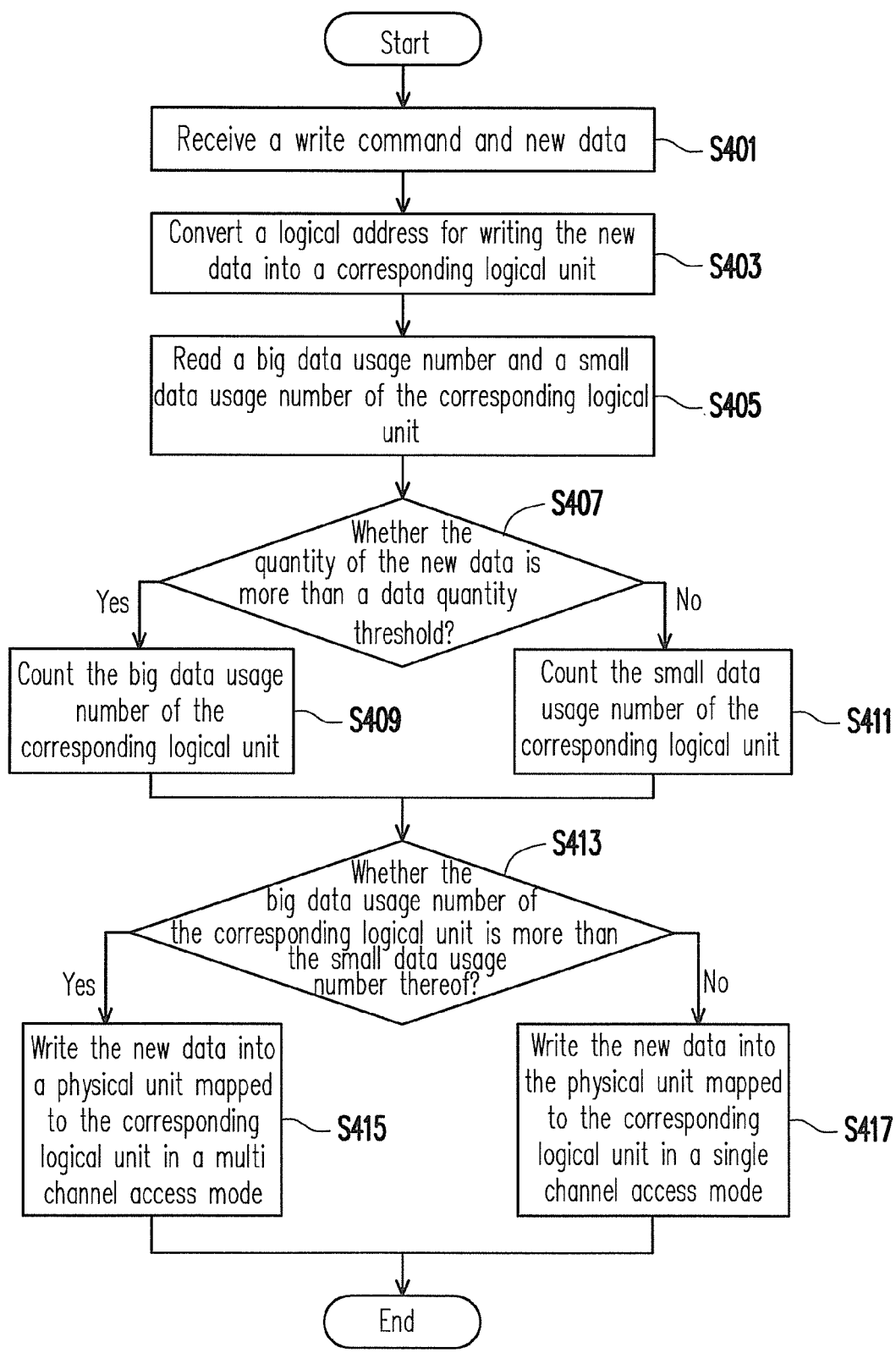
FIG. 4 is a flowchart of data writing steps according to an exemplary embodiment of the present invention.

FIG. 4 is a flowchart of data writing steps according to an exemplary embodiment of the present invention.

Referring to FIG. 4, in step S401, the flash memory controller 110 receives a write command and a new data from the host system 200, wherein the write command contains the logic address for writing the new data.

Then, in step S403, the memory management unit 110b of the flash memory controller 110 converts the logic address for writing the new data into a corresponding logical unit, and in step S405, the memory management unit 110b reads the big data usage number and the small data usage number of the corresponding logical unit.

In step S407, the memory management unit 110b determines whether the quantity of the new data is more than a data quantity threshold. If the quantity of the new data is more than the data quantity threshold, in step S409, the memory management unit 110b counts the big data usage number of the corresponding logical unit (for example, by adding 1 to the big data usage number), and if the quantity of the new data is not more than the data quantity threshold, in step S411, the memory management unit 110b counts the small data usage number of the corresponding logical unit (for example, by adding 1 to the small data usage number).

After that, in step S413, the memory management unit 110b determines whether the big data usage number of the corresponding logical unit is more than the small data usage number thereof. If the big data usage number of the corresponding logical unit is more than the small data usage number thereof, in step S415, the memory management unit 110b writes the new data into the physical unit mapped to the corresponding logical unit in the multi channel access mode. If the big data usage number of the corresponding logical unit is not more than the small data usage number thereof, in step S417, the memory management unit 110b writes the new data into the physical unit mapped to the corresponding logical unit in the single channel access mode.

It should be mentioned that as shown in FIG. 3C(a), if the logical unit to be written by the host system 200 still contains valid old data, the memory management unit 110b copies the valid old data between the addresses for writing the new data into a newly selected physical unit and then continues to write the new data. Such a writing mode is referred to as a continuous writing mode. However, when the host system 200 constantly writes discontinuous small data into the same logical unit (this is substantially referred to as a random writing state), the action for copying the valid old data may cause series delay in the writing operation of the flash memory storage system 100. In this case, the memory management unit 110*b* directly writes the new data into the selected physical unit, and when the memory management unit 110*b* closes the mother-child units, it selects another physical unit from the spare area 306 for sorting and writing all the valid data in sequence.

Figure 5:
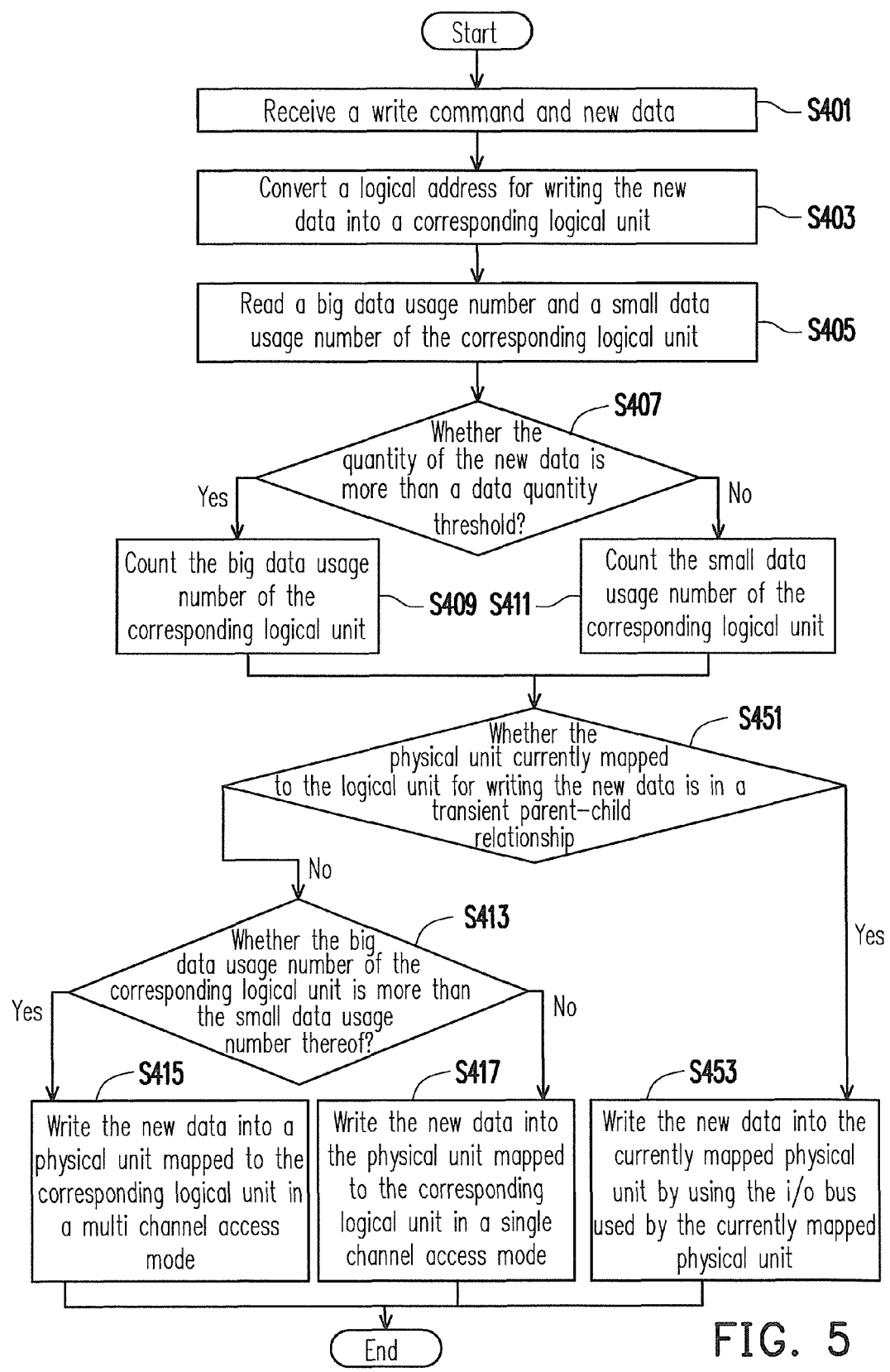
FIG. 5 is a flowchart of data writing steps according to another exemplary embodiment of the present invention.

It should be mentioned that in another exemplary embodiment of the present invention (illustrated in FIG. 5), before step S413 is executed, the memory management unit 110*b* further determines whether the physical unit currently mapped to the logical unit for writing the new data is already in a transient mother-child relationship (step S451). If the physical unit currently mapped to the logical unit for writing the new data is already in the transient mother-child relationship, the memory management unit 110*b* directly writes the new data by using the I/O bus which is previously used for establishing the transient mother-child relationship (S453). Step S413 is only executed if the physical unit currently mapped to the logical unit for writing the new data is not in the transient mother-child relationship. For example, if the flash memory storage system allows at most five sets of transient mother-child relationship at one time and currently there are already five sets of such transient mother-child relationship in the system, to establish a new transient mother-child relationship, the memory management unit 110*b* needs to delete at least one existing set of transient mother-child relationship. Thus, when the flash memory storage system receives a write command, if the flash memory storage system realizes that the logical unit corresponding to the write command is still in a transient mother-child relationship and it is decided that two channels are to be used when the transient mother-child relationship is established, the number of channels to be used for writing the data is not determined through the steps described in the present exemplary embodiment; instead, the flash memory storage system also writes the data by using double channels.

Figure 6A:
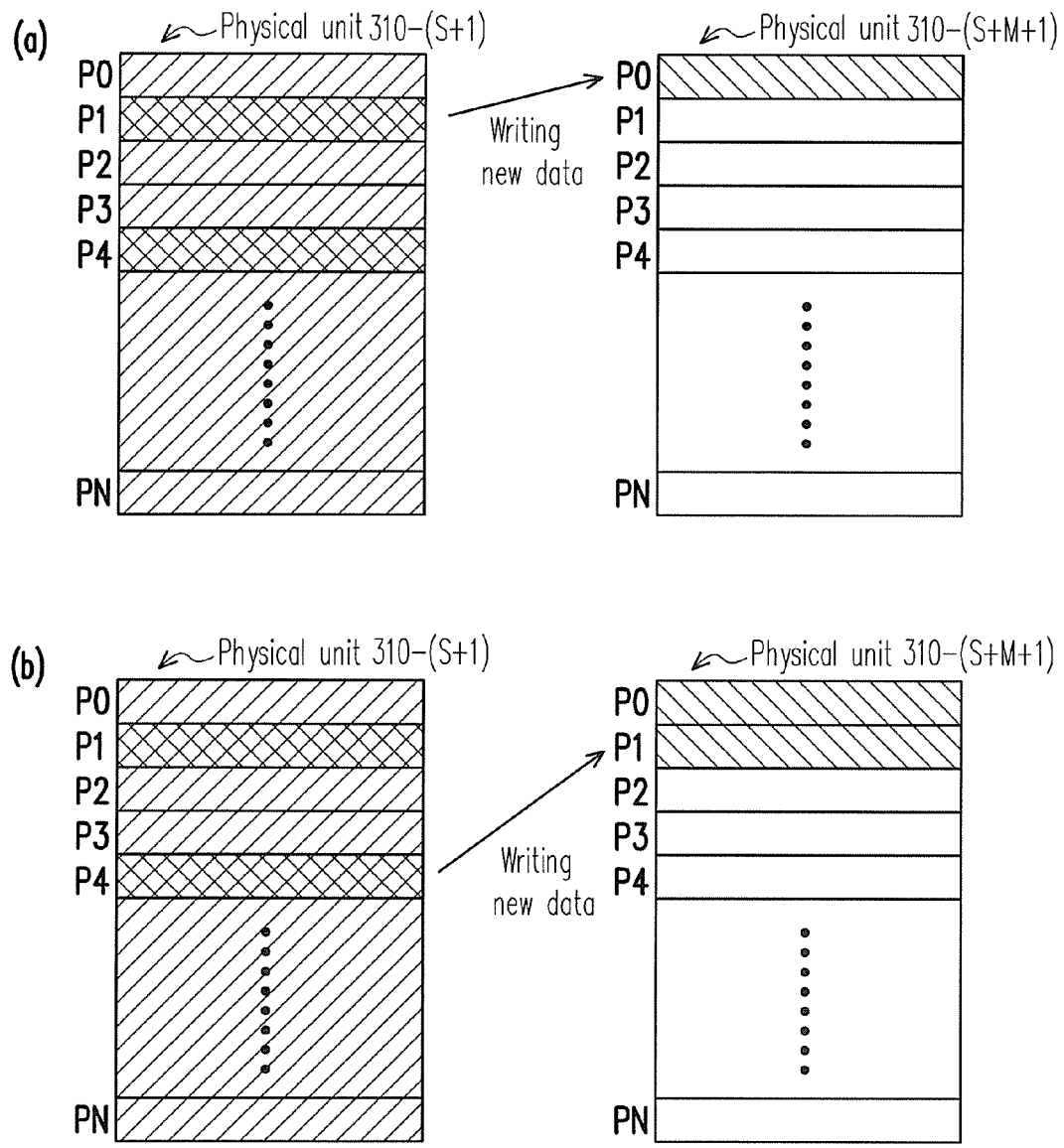
FIGS. 6A and 6B are diagrams illustrating the operations of a flash memory chip according to another exemplary embodiment of the present invention.
Figure 6B:
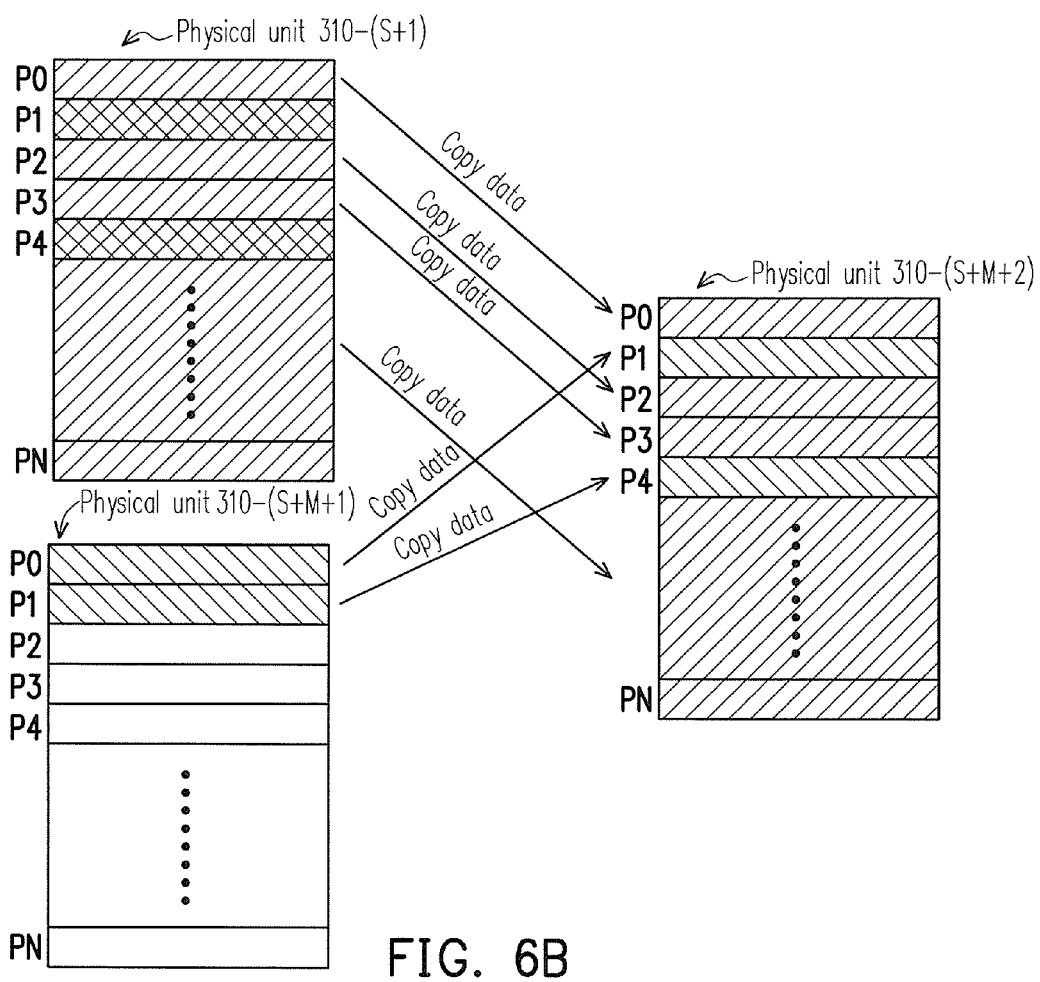

FIG. 6A and FIG. 6B are diagrams illustrating the operations of a flash memory chip according to another exemplary embodiment of the present invention.

Referring to FIG. 6A, for example, when the host system writes discontinuous small data into the pages P1 and P4 of the logical unit 350-1, the memory management unit 110*b* gets to know that the logical unit 350-1 is currently mapped to the physical unit 310-(S+1) in the data area 304 according to the logical address-physical address mapping table. Accordingly, the memory management unit 110*b* updates the data in the physical unit 310-(S+1), and meanwhile, the memory management unit 110*b* selects the physical unit 310-(S+M+1) from the spare area 306 and writes the data in the page P1 of the logical unit 350-1 into the page P0 of the physical unit 310-(S+M+1) (as shown in FIG. 6A(a)). After that, the memory management unit 110*b* writes the data in the page P4 of the logical unit 350-1 into the page P1 of the physical unit 310-(S+M+1) (as shown in FIG. 6A(b)).

Referring to FIG. 6B, while closing the mother-child units (i.e., integrating the valid data in the physical unit 310-(S+M+1) and the physical unit 310-(S+1)), the memory management unit 110*b* selects the physical unit 310-(S+M+2) from the spare area 306. After that, the memory management unit 110*b* copies the valid old data in the pages P0, P2, P3 and pages P5-PN of the physical unit 310-(S+1) to the pages P0, P2, P3 and pages P5-PN of the physical unit 310-(S+M+2) and copies the new data in the pages P0 and P1 of the physical unit 310-(S+M+1) to the pages P1 and P4 of the physical unit 310-(S+M+2), wherein all the valid data is sequentially written into each page according to the order of the pages in the physical unit 310-(S+M+2). Such a writing mode is also referred to as a random writing mode.

In another exemplary embodiment of the present invention, the memory management unit 110*b* can write the data from the host system 200 in either the continuous writing mode (as shown in FIG. 3C) or the random writing mode (as shown in FIG. 6A) after it obtains the usage patterns of the logical units 350-1~350-M.

For example, when the host system 200 writes data into the logical unit 350-1, the memory management unit 110*b* can obtain whether the logical unit 350-1 is always used for storing big data or small data. If the logical unit 350-1 is always used for storing big data, the memory management unit 110*b* writes the data from the host system 200 into the corresponding physical unit in the continuous writing mode. If the logical unit 350-1 is always used for storing small data, the memory management unit 110*b* writes the data from the host system 200 into the corresponding physical unit in the random writing mode.

Figure 7:
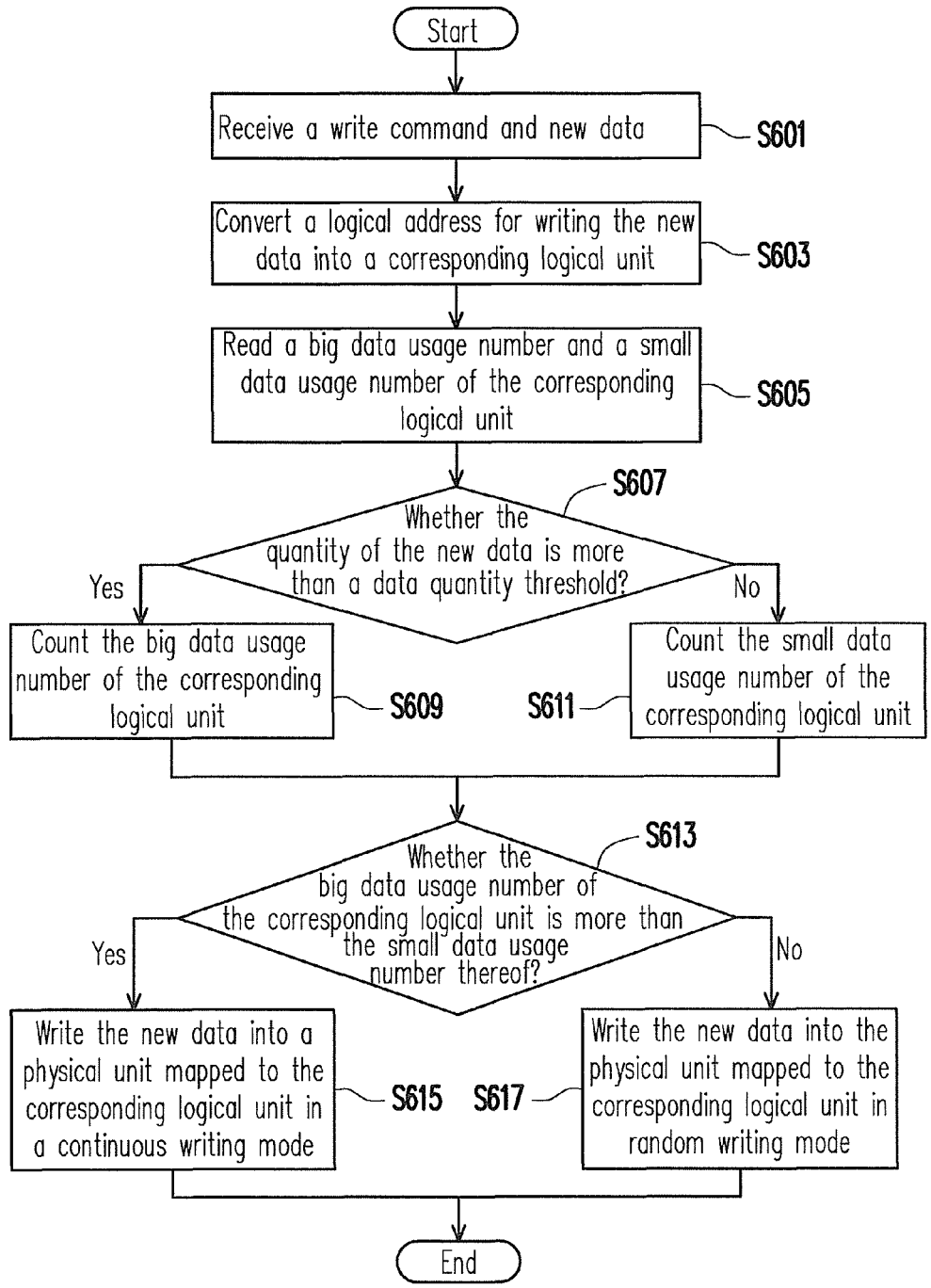
FIG. 7 is a flowchart of data writing steps according to yet another exemplary embodiment of the present invention.

FIG. 7 is a flowchart of data writing steps according to another exemplary embodiment of the present invention.

Referring to FIG. 7, the steps S601, S603, S605, S607, S609, S611, and S613 are the same as the steps S401, S403, S405, S407, S409, S411, and S413 in FIG. 4 therefore will not be described herein.

Thereafter, if the big data usage number of the corresponding logical unit is more than the small data usage number thereof, in step S615, the memory management unit 110*b* writes the new data into the physical unit mapped to the corresponding logical unit in the continuous writing mode. If the big data usage number of the corresponding logical unit is not more than the small data usage number thereof, in step S617, the memory management unit 110*b* writes the new data into the physical unit mapped to the corresponding logical unit in the random writing mode.

Figure 8:
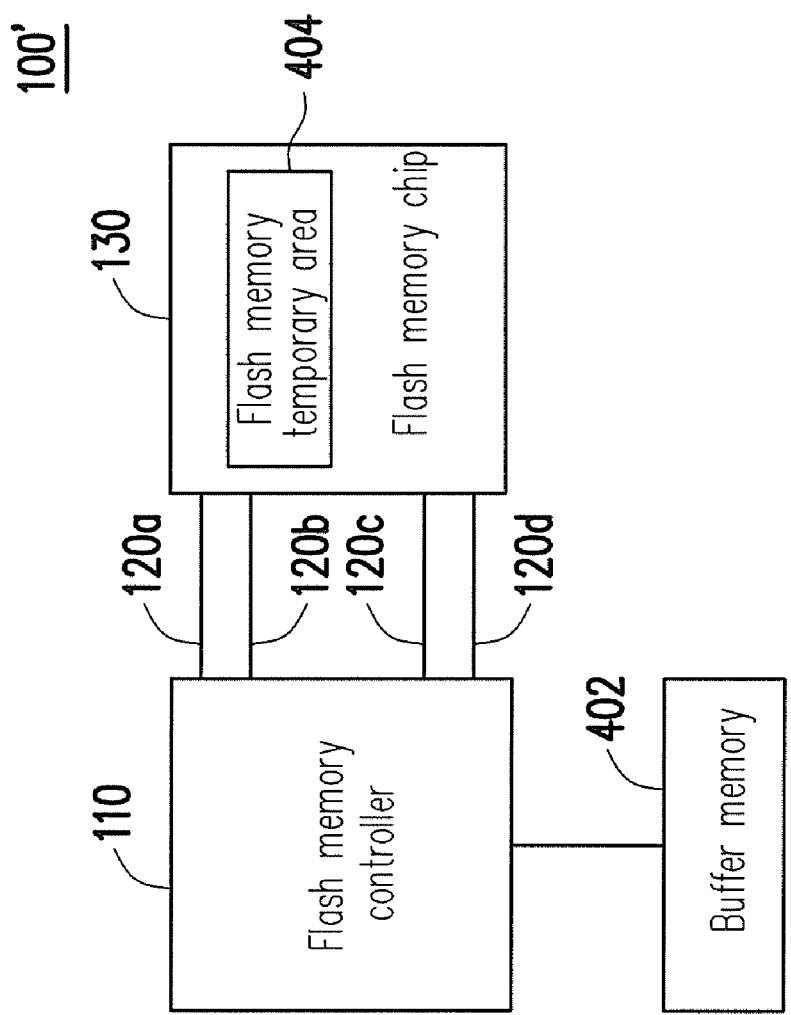
FIG. 8 is a schematic block diagram of a flash memory storage system according to another exemplary embodiment of the present invention.

In another exemplary embodiment of the present invention, the flash memory storage system further includes a buffer memory and a flash memory temporary area. FIG. 8 is a schematic block diagram of a flash memory storage system 100' according to another exemplary embodiment of the present invention.

Compared to the flash memory storage system 100 illustrated in FIG. 1, the flash memory storage system 100' further includes a buffer memory 402 and a flash memory temporary area 404.

The buffer memory 402 is coupled to the flash memory controller 110 for temporarily storing data accessed by the host system 200. In the present exemplary embodiment, the buffer memory 402 is a dynamic random access memory (DRAM). However, the present invention is not limited thereto, and a magnetoresistive random access memory (MRAM), a phase change random access memory (PRAM), or other suitable memories may also be applied in the present invention.

The flash memory temporary area 404 stores data temporarily. In particular, as described above, a physical block in the flash memory chip 130 has to be erased before new data can be written therein. Accordingly, in the flash memory storage system 100' having the flash memory temporary area 404, the flash memory controller 110 temporarily stores the data to be written by the host system 200 into the flash memory temporary area 404 first, so that it can respond to the host system 200 quickly to notify the host system 200 that the write command issued by the host system 200 is already completed. Later, the flash memory controller 110 writes the data temporarily stored in the flash memory temporary area 404 into the corresponding physical unit when the flash memory storage system 100' is not busy (for example, when the host system 200 does not issue any command by using the channel corresponding to the logical unit).

In the present exemplary embodiment, the flash memory temporary area 404 is composed of some physical blocks in the flash memory chip 130. However, the present invention is not limited thereto, and in another embodiment of the present invention, another flash memory chip may be disposed as the flash memory temporary area 404.

Similarly, in the flash memory storage system 100' having the buffer memory 402 and the flash memory temporary area 404, the memory management unit 110b can temporarily store the data received from the host system 200 into the buffer memory 402 or the flash memory temporary area 404 after it gets to know the usage patterns of the logical units 350-1~350-M.

For example, when the host system 200 writes data into the logical unit 350-1, the memory management unit 110b can get to know whether the logical unit 350-1 is frequently used for writing data and whether it is always used for storing big data or small data. For example, if a total usage number (i.e., the sum of the big data usage number and the small data usage number of the logical unit 350-1) of the logical unit 350-1 is more than a total usage number threshold, the memory management unit 110b determines that the logical unit 350-1 is frequently used for writing data. If the total usage number of the logical unit 350-1 is not more than the total usage number threshold, the memory management unit 110b determines that the logical unit 350-1 is not frequently used for writing data. The total usage number threshold can be determined by a user. In the present exemplary embodiment, the total usage number threshold is an average of the usage numbers of all the existing logical units.

If the logical unit 350-1 is frequently used for writing data, the memory management unit 110b temporarily stores the data received from the host system 200 into the buffer memory 402. If the logical unit 350-1 is not frequently used for writing data, the memory management unit 110b further determines whether the logical unit 350-1 is always used for storing big data or small data. If the logical unit 350-1 is always used for storing small data, the memory management unit 110b temporarily stores the data received from the host system 200 into the flash memory temporary area 404. If the logical unit 350-1 is always used for storing big data, the memory management unit 110b directly writes the data received from the host system 200 into the physical unit mapped to the logical unit 350-1.

Figure 9:
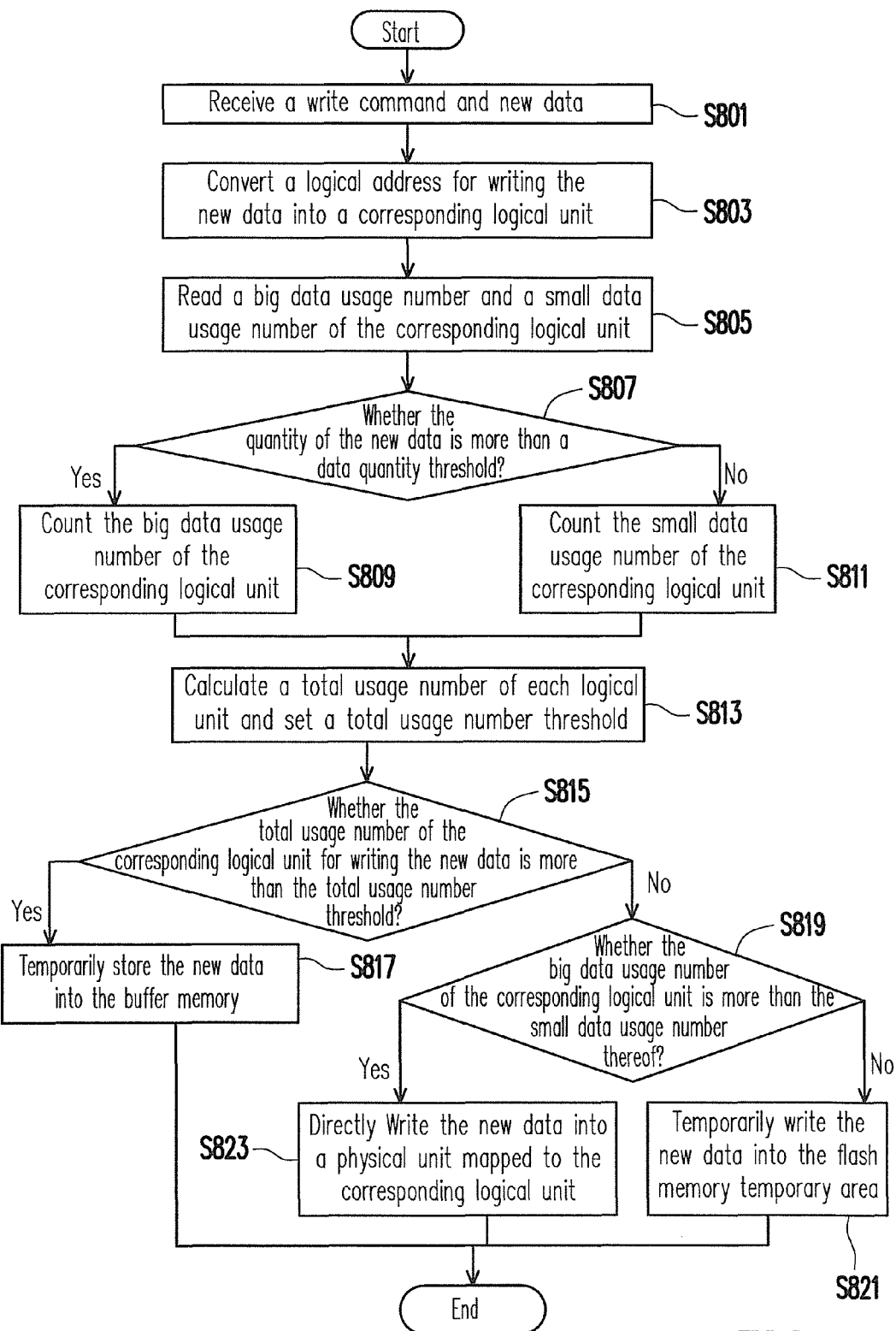
FIG. 9 is a flowchart of data writing steps according to still another exemplary embodiment of the present invention.

FIG. 9 is a flowchart of data writing steps according to another exemplary embodiment of the present invention.

Referring to FIG. 9, steps S801, S803, S805, S807, S809, and S811 are the same as the steps S401, S403, S405, S407, S409, and S411 in FIG. 4 therefore will not be described herein.

In step S813, the memory management unit 110b calculates the total usage number of each of the logical units 350-1~350-M and sets a total usage number threshold. In the present embodiment, the total usage number threshold is set as the average of the usage numbers of the logical units 350-1~350-M.

After that, in step S815, the memory management unit 110b determines whether the total usage number of a corresponding logical unit for writing the new data is more than the total usage number threshold. If the total usage number of the corresponding logical unit is more than the total usage number threshold, in step S817, the memory management unit 110b temporarily stores the new data into the buffer memory 402.

In addition, if the total usage number of the corresponding logical unit is not more than the total usage number threshold, in step S819, the memory management unit 110b further determines whether the big data usage number of the corresponding logical unit is more than the small data usage number thereof. If the big data usage number of the corresponding logical unit is not more than the small data usage number thereof, in step S821, the memory management unit 110b temporarily stores the new data into the flash memory temporary area 404. If the big data usage number of the corresponding logical unit is more than the small data usage number thereof, in step S823, the memory management unit 110b directly writes the new data into the physical unit mapped to the corresponding logical unit.

As described above, in the present invention, a big data usage number and a small data usage number are counted for each logical unit such that data can be written through different writing processes according to the usage history of each logical unit. As described above, the flash memory controller writes data into a logical unit which is always used for storing big data in a multi channel access mode, so as to increase the writing speed. Besides, the flash memory controller writes data into a logical unit which is always used for storing small data in a single channel access mode or a random writing mode, so as to reduce the erase number of the corresponding physical block. Moreover, regarding a logical unit which is frequently used for writing data, the flash memory controller first temporarily stores the new data into a buffer memory, while regarding a logical unit which is not frequently used for writing data, the flash memory controller first temporarily stores the data into a flash memory temporary area if the logical unit is always used for storing small data and directly writes the data into the corresponding physical unit if the logical unit is always used for storing big data. Thereby, according to the present invention, data can be written into the flash memory storage system through different processes according to the using behaviour of a user, so that the data writing efficiency of the flash memory storage system can be improved and the lifespan thereof can be prolonged.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory writing method, executed by a flash memory storage system, wherein the flash memory storage system comprises a plurality of logical units and a plurality of physical units, each of the logical units is mapped to at least one of the physical units, and each of the physical units has at least one flash memory cell, the flash memory writing method comprising:

counting a big data usage number and a small data usage number for each of the logical units by a memory management unit, wherein the big data usage numbers respectively represent the number of writing big data into each of the logical units, the small data usage numbers respectively represent the number of writing small data into each of the logical units, data length of the big data is more than a data quantity threshold, and data length of the small data is not more than the data quantity threshold; and when a host system writes new data into a corresponding logical unit among the logical units, writing the new data into the flash memory storage system according to data writing steps corresponding to the big data usage number or the small data usage number of the corresponding logical unit.

2. The flash memory writing method according to claim 1, wherein the step of counting the big data usage number and the small data usage number for each of the logical units comprises:

determining whether data length of the new data is more than the data quantity threshold;

counting the big data usage number of the corresponding logical unit when the data length of the new data is more than the data quantity threshold; and counting the small data usage number of the corresponding logical unit when the data length of the new data is not more than the data quantity threshold.

3. The flash memory writing method according to claim 1, wherein the flash memory storage system further comprises a plurality of I/O buses, and the step of writing the new data into the flash memory storage system according to the data writing steps corresponding to the big data usage number or the small data usage number of the corresponding logical unit comprises:

determining whether the big data usage number of the corresponding logical unit is more than the small data usage number of the corresponding logical unit;

writing the new data into the physical unit mapped to the corresponding logical unit through at least two of the I/O buses when the big data usage number of the corresponding logical unit is more than the small data usage number of the corresponding logical unit; and writing the new data into the physical unit mapped to the corresponding logical unit through one of the I/O buses when the big data usage number of the corresponding logical unit is not more than the small data usage number of the corresponding logical unit.

4. The flash memory writing method according to claim 1, wherein when the corresponding logical unit stores a valid old data, the step of writing the new data into the flash memory storage system according to the data writing steps corresponding to the big data usage number or the small data usage number of the corresponding logical unit comprises:

determining whether the big data usage number of the corresponding logical unit is more than the small data usage number of the corresponding logical unit; and copying the valid old data, and writing the valid old data and the new data into the physical unit mapped to the corresponding logical unit when the big data usage number of the corresponding logical unit is more than the small data usage number of the corresponding logical unit.

5. The flash memory writing method according to claim 4 further comprising only writing the new data into the physical unit mapped to the corresponding logical unit when the big data usage number of the corresponding logical unit is not more than the small data usage number of the corresponding logical unit.

6. The flash memory writing method according to claim 1, wherein when the flash memory storage system further comprises a buffer memory, the step of writing the new data into the flash memory storage system according to the data writing steps corresponding to the big data usage number or the small data usage number of the corresponding logical unit comprises:

calculating a total usage number of the corresponding logical unit according to the big data usage number and the small data usage number of the corresponding logical unit;

determining whether the total usage number of the corresponding logical unit is more than a total usage number threshold;

temporarily storing the new data into the buffer memory when the total usage number of the corresponding logical unit is more than the total usage number threshold;

writing the new data into the physical unit mapped to the corresponding logical unit when the total usage number of the corresponding logical unit is not more than the total usage number threshold.

7. The flash memory writing method according to claim 6 further comprising grouping a part of the physical units into a flash memory temporary area and a spare area, wherein the step of writing the new data into the physical unit mapped to the corresponding logical unit comprises:

determining whether the big data usage number of the corresponding logical unit is more than the small data usage number of the corresponding logical unit;

writing the new data into the physical unit in the spare area wherein when the big data usage number of the corresponding logical unit is more than the small data usage number of the corresponding logical unit; and temporarily writing the new data into the physical unit in the flash memory temporary area when the big data usage number of the corresponding logical unit is not more than the small data usage number of the corresponding logical unit.

8. The flash memory writing method according to claim 3 further comprising:

determining whether the physical unit mapped to the corresponding logical unit is in a transient mother-child relationship;

writing the new data into the physical unit mapped to the corresponding logical unit through the I/O bus used by the physical unit mapped to the corresponding logical unit when the physical unit mapped to the corresponding logical unit is in the transient mother-child relationship.

9. A flash memory controller, for controlling a flash memory storage system, wherein the flash memory storage system comprises a plurality of logical units and a plurality of physical units, and each of the logical units is mapped to at least one of the physical units, the flash memory controller comprising:

a microprocessor unit;

a host interface unit, for electrically connecting a host system;

a flash memory interface unit, for electrically connecting the physical units; and a memory management unit, for counting a big data usage number and a small data usage number for each of the logical units, and when the host system writes new data into a corresponding logical unit among the logical units, writing the new data into the flash memory storage system according to data writing steps corresponding to the big data usage number or the small data usage number of the corresponding logical unit, wherein the big data usage numbers respectively represent the number of writing big data into each of the logical units, the small data usage numbers respectively represent a number of writing small data into each of the logical units, data length of the big data is more than a data quantity threshold, and data length of the small data is not more than the data quantity threshold.

10. The flash memory controller according to claim 9, wherein the memory management unit determines whether data length of the new data is more than the data quantity threshold, wherein the memory management unit counts the big data usage number of the corresponding logical unit when the data length of the new data is more than the data quantity threshold, and the memory management unit counts the small data usage number of the corresponding logical unit when the data length of the new data is not more than the data quantity threshold.

11. The flash memory controller according to claim 9, wherein the flash memory storage system further comprises a plurality of I/O buses, and the memory management unit determines whether the big data usage number of the corresponding logical unit is more than the small data usage number of the corresponding logical unit, wherein the memory management unit writes the new data into the physical unit mapped to the corresponding logical unit through at least two of the I/O buses when the big data usage number of the corresponding logical unit is more than the small data usage number of the corresponding logical unit, and the memory management unit writes the new data into the physical unit mapped to the corresponding logical unit through one of the I/O buses when the big data usage number of the corresponding logical unit is not more than the small data usage number of the corresponding logical unit.

12. The flash memory controller according to claim 9, wherein when the corresponding logical unit stores a valid old data, the memory management unit determines whether the big data usage number of the corresponding logical unit is more than the small data usage number of the corresponding logical unit, and wherein when the big data usage number of the corresponding logical unit is more than the small data usage number of the corresponding logical unit, the memory management unit copies the valid old data and writes the valid old data and the new data into the physical unit mapped to the corresponding logical unit.

13. The flash memory controller according to claim 12, wherein when the big data usage number of the corresponding logical unit is not more than the small data usage number of the corresponding logical unit, the memory management unit writes only the new data into the physical unit mapped to the corresponding logical unit.

14. The flash memory controller according to claim 9, wherein the flash memory storage system further comprises a buffer memory, and the memory management unit calculates a total usage number of the corresponding logical unit according to the big data usage number and the small data usage number of the corresponding logical unit, determines whether the total usage number of the corresponding logical unit is more than a total usage number threshold, and determines whether the big data usage number of the corresponding logical unit is more than the small data usage number of the corresponding logical unit, wherein when the total usage number of the corresponding logical unit is more than the total usage number threshold, the memory management unit temporarily stores the new data into the buffer memory.

15. The flash memory controller according to claim 14, wherein the memory management unit groups a part of the physical units into a flash memory temporary area and a spare area, wherein when the total usage number of the corresponding logical unit is not more than the total usage number threshold and the big data usage number of the corresponding logical unit is more than the small data usage number of the corresponding logical unit, the memory management unit writes the new data into the physical unit in the spare area, wherein when the total usage number of the corresponding logical unit is not more than the total usage number threshold and the big data usage number of the corresponding logical unit is not more than the small data usage number of the corresponding logical unit, the memory management unit temporarily writes the new data into the physical unit in the flash memory temporary area.

16. The flash memory controller according to claim 11, wherein the memory management unit determines whether the physical unit mapped to the corresponding logical unit is in a transient mother-child relationship, wherein when the physical unit mapped to the corresponding logical unit is in the transient mother-child relationship, the memory management unit writes the new data into the physical unit mapped to the corresponding logical unit through the I/O bus used by the physical unit mapped to the corresponding logical unit.

17. A flash memory storage system, comprising:
a plurality of logical units, accessed by a host system;
a plurality of physical units, wherein each of the logical units is mapped to at least one of the physical units; and
a flash memory controller, for counting a big data usage number and a small data usage number for each of the logical units, wherein the big data usage numbers respectively represent the number of writing big data into each of the logical units, the small data usage numbers respectively represent the number of writing small data into each of the logical units, data length of the big data is more than a data quantity threshold, and data length of the small data is not more than the data quantity threshold, wherein when the host system writes new data into a corresponding logical unit among the logical units, the flash memory controller processes the new data according to data writing steps corresponding to the big data usage number or the small data usage number of the corresponding logical unit.

18. The flash memory storage system according to claim 17, wherein the flash memory controller determines whether data length of the new data is more than the data quantity threshold, wherein the flash memory controller counts the big data usage number of the corresponding logical unit when the data length of the new data is more than the data quantity threshold, and the flash memory controller counts the small data usage number of the corresponding logical unit when the data length of the new data is not more than the data quantity threshold.

19. The flash memory storage system according to claim 17, further comprising a plurality of I/O buses, wherein the flash memory controller determines whether the big data usage number of the corresponding logical unit is more than the small data usage number of the corresponding logical unit, wherein the flash memory controller writes the new data into the physical unit mapped to the corresponding logical unit through at least two of the I/O buses when the big data usage number of the corresponding logical unit is more than the small data usage number of the corresponding logical unit, and the flash memory controller writes the new data into the physical unit mapped to the corresponding logical unit through one of the I/O buses when the big data usage number of the corresponding logical unit is not more than the small data usage number of the corresponding logical unit.

20. The flash memory storage system according to claim 17, wherein when the corresponding logical unit stores a valid old data, the flash memory controller determines whether the big data usage number of the corresponding logical unit is more than the small data usage number of the corresponding logical unit, and wherein the flash memory controller copies the valid old data and writes the valid old data and the new data into the physical unit mapped to the corresponding logical unit when the big data usage number of the corresponding logical unit is more than the small data usage number of the corresponding logical unit.

21. The flash memory storage system according to claim 20, wherein the flash memory controller writes only the new data into the physical unit mapped to the corresponding logical unit when the big data usage number of the corresponding logical unit is not more than the small data usage number of the corresponding logical unit.

22. The flash memory storage system according to claim 17 further comprising a buffer memory, wherein the flash memory controller calculates a total usage number of the corresponding logical unit according to the big data usage number and the small data usage number of the corresponding logical unit, determines whether the total usage number of the corresponding logical unit is more than a total usage number threshold, and determines whether the big data usage number of the corresponding logical unit is more than the small data usage number of the corresponding logical unit, wherein the flash memory controller temporarily stores the new data into the buffer memory when the total usage number of the corresponding logical unit is more than the total usage number threshold.

23. The flash memory storage system according to claim 22, wherein the flash memory controller groups a part of the physical units into a flash memory temporary area and a spare area, wherein the flash memory controller writes the new data into the physical unit in the spare area when the total usage number of the corresponding logical unit is not more than the total usage number threshold and the big data usage number of the corresponding logical unit is more than the small data usage number of the corresponding logical unit, wherein the flash memory controller temporarily writes the new data into the physical unit in the flash memory temporary area when the total usage number of the corresponding logical unit is not more than the total usage number threshold and the big data usage number of the corresponding logical unit is not more than the small data usage number of the corresponding logical unit.

24. The flash memory storage system according to claim 19, wherein the flash memory controller determines whether the physical unit mapped to the corresponding logical unit is in a transient mother-child relationship, wherein the flash memory controller writes the new data into the physical unit mapped to the corresponding logical unit through the I/O bus used by the physical unit mapped to the corresponding logical unit when the physical unit mapped to the corresponding logical unit is in the transient mother-child relationship.

* * * * *